United States Patent [19]

Lee et al.

[11] Patent Number: 5,619,223

[45] Date of Patent: Apr. 8, 1997

[54] APPARATUS FOR INCREASING THE EFFECTIVE YIELD OF DISPLAYS WITH INTEGREGATED ROW SELECT DRIVER CIRCUIT

[75] Inventors: Sywe N. Lee, Taipei; Dyi-Chung Hu; Huann-Min Tang, both of Shinchu, all of Taiwan

[73] Assignee: Prime View HK Limited, Hong Kong, Hong Kong

[21] Appl. No.: 227,716

[22] Filed: Apr. 14, 1994

[51] Int. Cl.[6] .................................. G09G 5/00; G09G 3/36
[52] U.S. Cl. .............................. 345/93; 345/100; 345/904
[58] Field of Search .................................. 345/90, 92, 93, 345/97, 98, 89, 100, 204, 197, 904, 208, 214; 348/792

[56] References Cited

U.S. PATENT DOCUMENTS

| | | | |
|---|---|---|---|
| 4,930,875 | 6/1990 | Inoue et al. | 345/97 |
| 5,063,378 | 11/1991 | Roach | 345/93 |
| 5,206,632 | 4/1993 | Dupont et al. | 345/92 |
| 5,313,222 | 5/1994 | Lee | 345/197 |
| 5,555,001 | 9/1996 | Lee et al. | 345/93 |

FOREIGN PATENT DOCUMENTS 1213623  8/1989  Japan ........................... 345/93

*Primary Examiner*—Richard Hjerpe
*Assistant Examiner*—Kara Farnandez Stoll
*Attorney, Agent, or Firm*—Jones, Day, Reavis & Pogue

[57] ABSTRACT

A redundant row select driver circuit system is provided for enhancing manufacturing yield and reducing manufacturing costs in the liquid crystal data displays. In particular, a row select driver circuit is provided with redundant subcircuits that can effectively replace any damaged subcircuit within the row select driver circuit. In addition, there is disclosed a capacitance compensating scheme to adjust the gray scale level in a damaged row select line with a break inside the display area. And finally, an enhanced diagnostic scheme is disclosed for testing of each row select driver subcircuits in a active matrix display having row select driver circuits connected to each end of row select lines.

14 Claims, 5 Drawing Sheets

APPARATUS FOR INCREASING THE EFFECTIVE YIELD OF DISPLAYS WITH INTEGREGATED ROW SELECT DRIVER CIRCUIT

BACKGROUND OF THE INVENTION

1. Field of the Invention

The present invention relates generally to displays and their associated row driving circuits and in particular to LCD displays using redundant schemes to compensate a damaged row select driver subcircuit. In addition, the present invention relates to displays that compensate for damaged row select lines within a display area.

2. Description of Related Art

An active matrix liquid crystal display device commonly comprises a plurality of pixel elements arranged in a matrix of rows and columns and supported on one side with a thin layer of electro-optic material.

Each picture element consists of a switching transistor, a liquid crystal cell, that can be modeled electrically as a capacitor known as a pixel capacitor, and an optional storage capacitor. One of the electrodes of the pixel capacitor is on one side of the matrix display and a common electrode for all the pixel capacitors is formed on the opposite side of the matrix display. The pixel element, including a liquid crystal cell and an optional storage capacitor, is driven by a thin film transistor (TFT) that is used as a switching device. The pixel transistor is used for transferring an input data signal to the corresponding pixel element.

The resolution of a picture is defined by the number of pixels in the display area. In a conventional unscanned LCD display with X columns and Y rows, the display requires X plus Y column and row driver leads. Therefore, it is clear, in the case of an unscanned LCD display that the greater the number of columns and rows in a display area the more input leads are required to connect external signals to the LCD display. This problem of unusually large numbers of external display leads has been addressed in the past. One solution has been to integrate a driver circuit directly onto the display substrate. This reduces the number of external input leads and driving chips significantly.

An integrated row select driver circuit on an LCD display substrate is disclosed in pending U.S. patent application Ser. No. 07/996,979 filed Dec. 24, 1992, entitled "A Select Driver Circuit for an LCD Display", now U.S. Pat. No. 5,313,222, and naming Sywe N. Lee as inventor and is hereby incorporated by reference. The select driver circuit disclosed in the above referenced patent application includes a plurality of row select driver subcircuits corresponding to the number of pixel row lines. An output of each of the row select driver subcircuits is connected to a corresponding pixel row line and to a successive row select driver subcircuit as an activating input. The basic block diagram of the display system that includes a display device having a TFT array in an integrated driver circuit formed on the display along with a peripheral control/drive circuit is shown in FIG. 1. FIG. 2 shows a more detailed circuit diagram for the row select driver circuit and its corresponding subcircuits with the external control and driver signals. FIGS. 2 discloses a circuit diagram wherein all even numbered stages include $VSS_y$ and all odd numbered stages or rows include $VSS_x$. The above referenced pending patent application also describes a circuit diagram wherein all stages are supplied with $VSS_x$ and would then require one less external lead to be connected to the row select driver circuit. In a case wherein a display has 384 columns and 240 rows there would be 92,106 pixels formed.

Transistors forming the row select driver circuits are usually thin film transistors deposited on the same substrate as the display pixel array. As shown in FIG. 2, only eleven external leads are required to connect the row select driver circuit in order to control 240 leads from each of the rows of the LCD display. This is in stark contrast to the 240 leads that would be required on a conventional unscanned LCD display. This reduction in the number of lead connections significantly simplifies the LCD assembly and packaging. In manufacturing an integrated row select driver circuit a portion of the row select driver circuit may be damaged or such defects as bad transistors, shorted lines, open lines, interlayer shorts, and other causes can lead to the malfunctioning all or a portion of the corresponding pixel row lines. In these cases of failure, a redundant row select driver circuit can compensate for these otherwise irreversible damages.

One such redundant scheme is disclosed in a patent to Asada, U.S. Pat. No. 5,111,060. Asada discloses providing a redundant or spare circuit element each and every primary circuit element. Asada then disclose electrically connecting a redundant circuit to a corresponding stage output where the primary circuit element is defective. This connection is made by such means as laser welding and the defective circuit is then electrically disconnected from the stage output. This means of providing redundant circuitry for a display requires having a complete duplicate row driver circuit that takes up valuable space on the substrate and in practice the vast majority of redundant circuits will never be used. It would be advantageous to provide a system wherein a number of redundant circuit elements could be provided that is less than the total number of primary circuit elements for driving the rows of a liquid crystal display. This would reduce the cost of manufacturing the display and be more efficient and cost effective in manufacturing.

SUMMARY OF THE INVENTION

It is an object of the present invention to provide a novel redundant row select driver subcircuit to replace a damaged row select driver subcircuit in an integrated driver of a liquid crystal display device.

It is another object of the invention to improve image quality of pixel row lines broken inside of the display area in an integrated driver liquid crystal display device.

It is another object of the invention to enhance diagnostics of a row select driver circuit by selectively disabling and enabling the row select driver subcircuits in an integrated liquid crystal display device.

A still further object of the invention is to increase the effective manufacturing yield of integrated driver liquid crystal devices and thereby reduce manufacturing costs.

Finally, it is another object of the invention to use minimal substrate area and wiring to implement the redundant row select driver subcircuits in an integrated driver liquid crystal display device.

In order to accomplish the above and other objects a row select driver circuit system is provided for correcting defects in an active matrix liquid crystal display formed on a substrate, preferably of glass, having a plurality of pixel elements formed in a plurality of rows and columns. The row select driver circuit system comprises at least a first row select driver circuit on the substrate having a subcircuit coupled to each row of the active matrix liquid crystal display for selectively activating the corresponding row of pixel elements. At least a first redundant subcircuit is deposited on the substrate and connecting means, also on the substrate, is electrically connected to the redundant subcircuit and selectively connectable to the row select driver circuit for replacing any defective subcircuit therein with the redundant subcircuit.

BRIEF DESCRIPTION OF THE DRAWINGS

These and other features of the present invention will be more fully disclosed in the following detailed description of the drawings in which like numerals represent like elements and in which.

DESCRIPTION OF THE PREFERRED EMBODIMENTS

Figure 2:
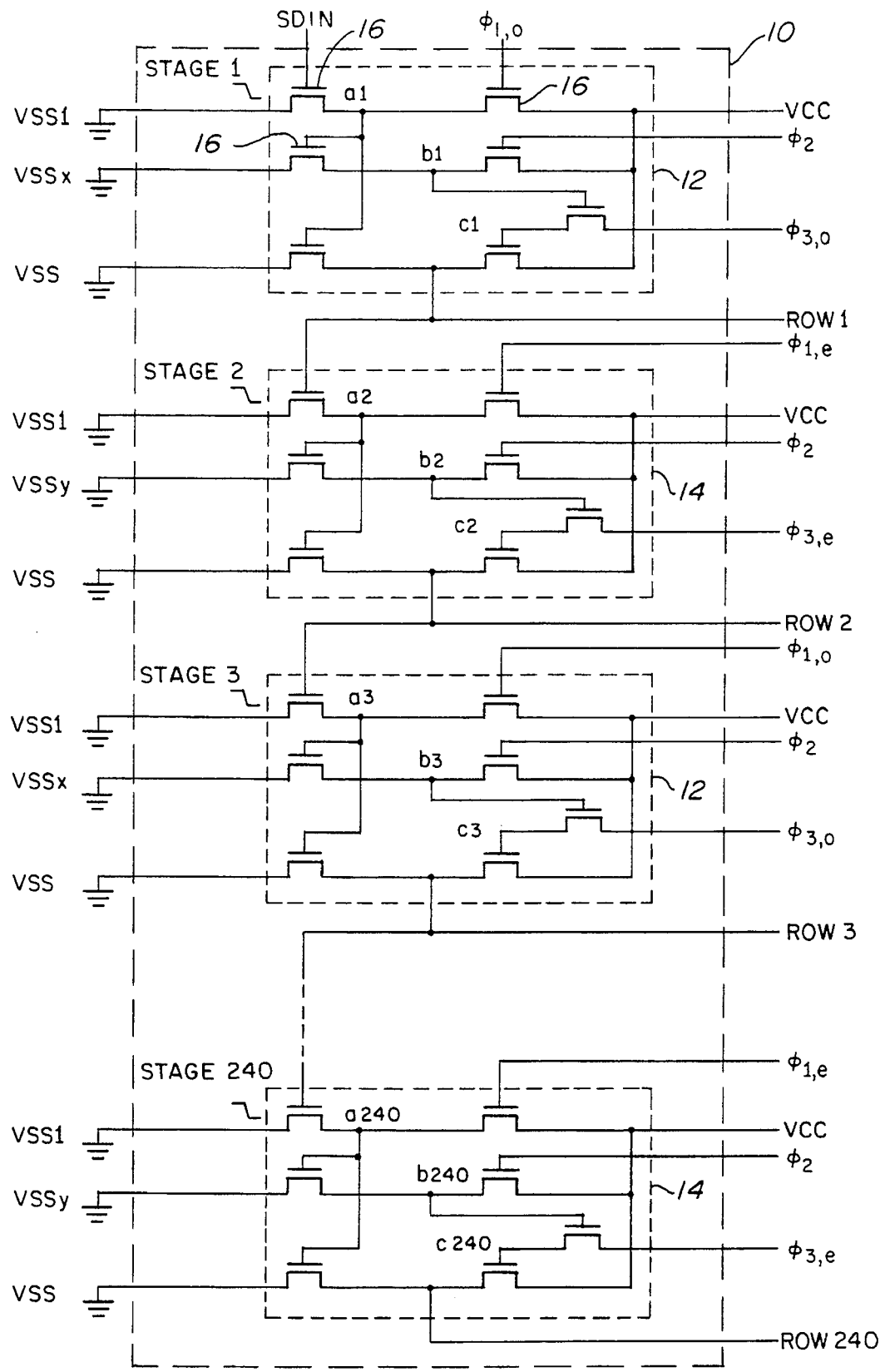
FIG. 2 is a schematic diagram of a row select driver circuit of FIG. 1.

In order to fully understand the present invention a brief description of the circuit of FIG. 2 is necessary. A row select driver circuit, shown in FIG. 2 as dashed line 10, is divided into odd and even stages 12 and 14 respectively with each stage or subcircuit 12 and 14 consisting of 7 transistors. The function of row select driver circuit 10 is similar to a shift register. A shift-in clock signal, SDIN, functions as an input to stage 1 of row select driver circuit 10. The output of stage 1 or subcircuit 12 is connected to the input of stage 2 or subcircuit 14, and to row 1 that is formed of a plurality of pixel transistors (not shown). The output of stage 2 is connected to the input of stage 3 and to row 2 and so forth through stage 240 in the present example. All stages are connected to a control signal $\phi_2$, a common power supply VCC, a common ground VSS, and common pseudo ground VSS1. All odd stages receive control signals $\phi_{1,o}$ and $\phi_{3,o}$ and are connected to pseudo ground $VSS_x$, and all the even stages receive control signals $\phi_{1,e}$ and $\phi_{3,e}$ and are connected to pseudo ground $VSS_y$.

The present invention is directed to novel redundant subcircuits for a row select driver circuit in a display device such as the active matrix liquid crystal display described above. Damaged transistors and damaged lines in row select driver subcircuits can cause corresponding pixel row lines to malfunction leading to an unusable and/or unacceptable display device.

Figure 3:
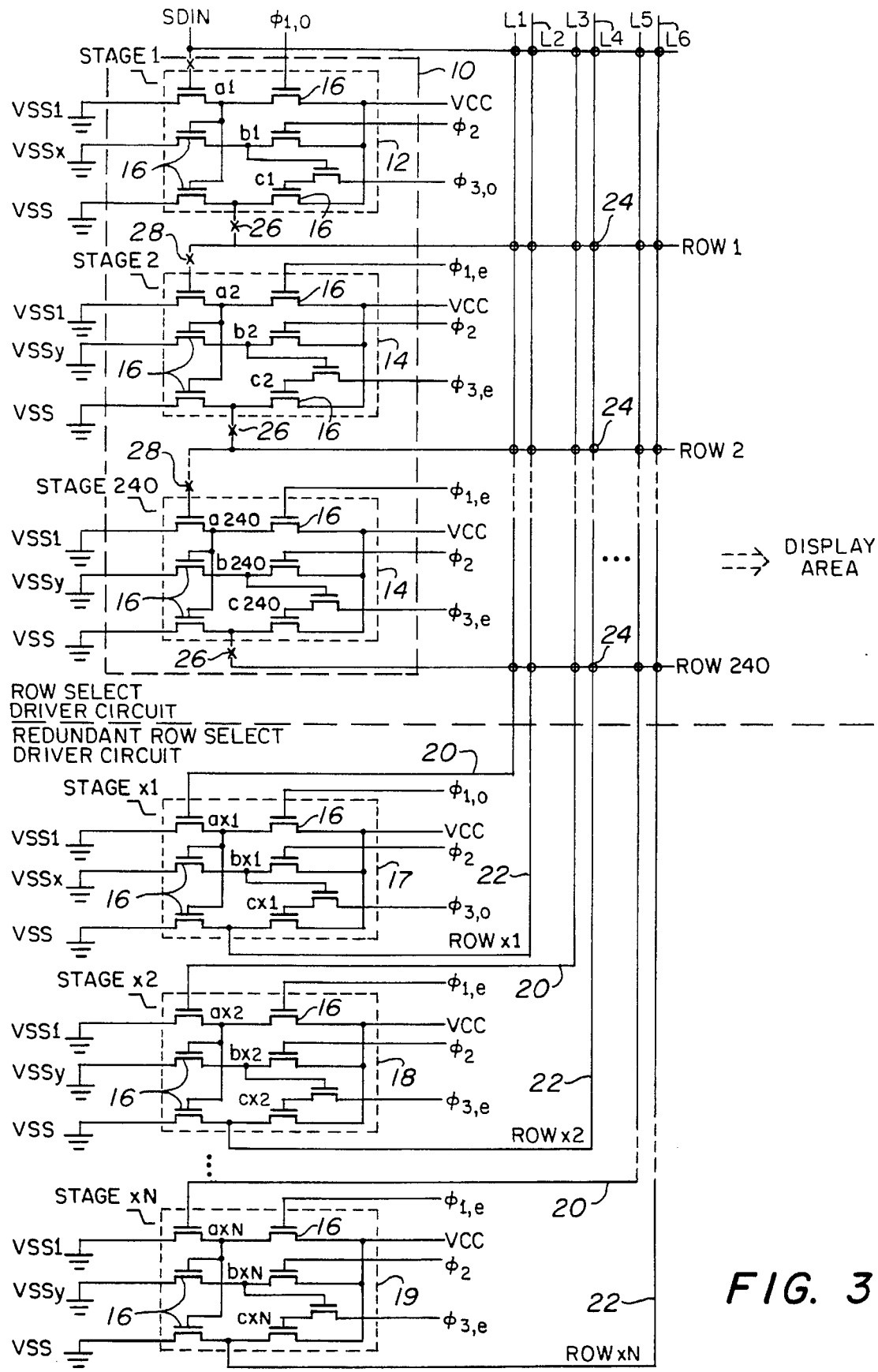
FIG. 3 is a schematic diagram in accordance with the present invention illustrating redundant subcircuits connectable to any row of the row select driver circuit.

FIG. 3 shows a typical row select driver circuit 10 with the addition of novel redundant subcircuits 17, 18, and 19 that may include as many as N redundant subcircuits. The N redundant subcircuits are exact copies of the respective sub circuits 12 and 14 of row select driver circuit 10 except that inputs 20 and outputs 22 of each of redundant subcircuits 17, 18, and 19 lie across but do not electrically contact each row of the display device. As can be seen in FIG. 3, inputs 20 also are connectable to the input of stage 1 so that stage 1 can also be replaced if it is damaged. In this manner they form potential welding points 24, shown at each row. X's 26 and 28 represent potential trimming points to disconnect any faulty subcircuit 12 or 14 from the row select driver circuit 10.

For example, if even phase stage 2 of row select driver 10 is damaged then even phase redundant subcircuit 18 can be hardwired by welding the crossing points at intersections of line 20 and row 1 and line 22 and row 2 to connect redundant subcircuit 18 to rows 1 and 2. The defective stage 2 is then electrically disconnected or isolated from driver circuit 10 and the corresponding rows 1 and 2 of the display device. This is done by cutting the input of stage 2 at X28 and the output of stage 2 at X26. As those skilled in the art will appreciate, the welding and the cutting may be accomplished by laser or other compatible methods well known in the art. Note that the input and output of the defective stage, in this case stage 2, must be electrically isolated from any row line and any preceding and succeeding subcircuits in order to maintain proper loading of the corresponding row 2. In this way even phase redundant subcircuit 18 has effectively replaced stage 2 of row select driver circuit 10. This can be done for any selected stage of row select driver circuit 10, either odd phase or even phase, and can be done as many times as there are odd phase and even phase redundant subcircuits. Thus, it has been shown that a damaged subcircuit can be replaced by welding two crossing points and cutting two connecting lines.

A potential welding spot 24 is formed by two different metal plates crossed at a predetermined point with a thin insulation layer sandwiched between the two plates. Then, in order to electrically connect the two plates a fusion method such as laser welding can be used. Another approach to electrically short two lines is a direct write method that is used to short two adjacent but non-overlapping lines on the same layer of substrate. The direct write method can use either a laser or an electron beam. For example, one can use a precursor such as $(CH_3)_2$ Au, and laser energy to heat the spot between the adjacent lines so that gold is deposited between the adjacent lines, thereby electrically shorting the lines. As those skilled in the art will appreciate, laser welding, direct write, or other methods may be used to electrically connect two spots or lines on the substrate.

As stated previously it is common practice to have an identical redundant row select driver circuit 10 on the opposite side of a display substrate 8 in order to drive each row from both sides. This is shown in the display system of FIG. 1. The N redundant subcircuits 17, 18, and 19 disclosed above can still be used for compensating driver circuits on both sides of the substrate by providing the N subcircuits for both row select driver circuits 10. Obviously, it is necessary to use at least one of the redundant subcircuits to replace one of two damaged row select driver subcircuits 12 or 14, respectively, if those two damaged driver subcircuits are on both ends of the same pixel row line.

Figure 1:
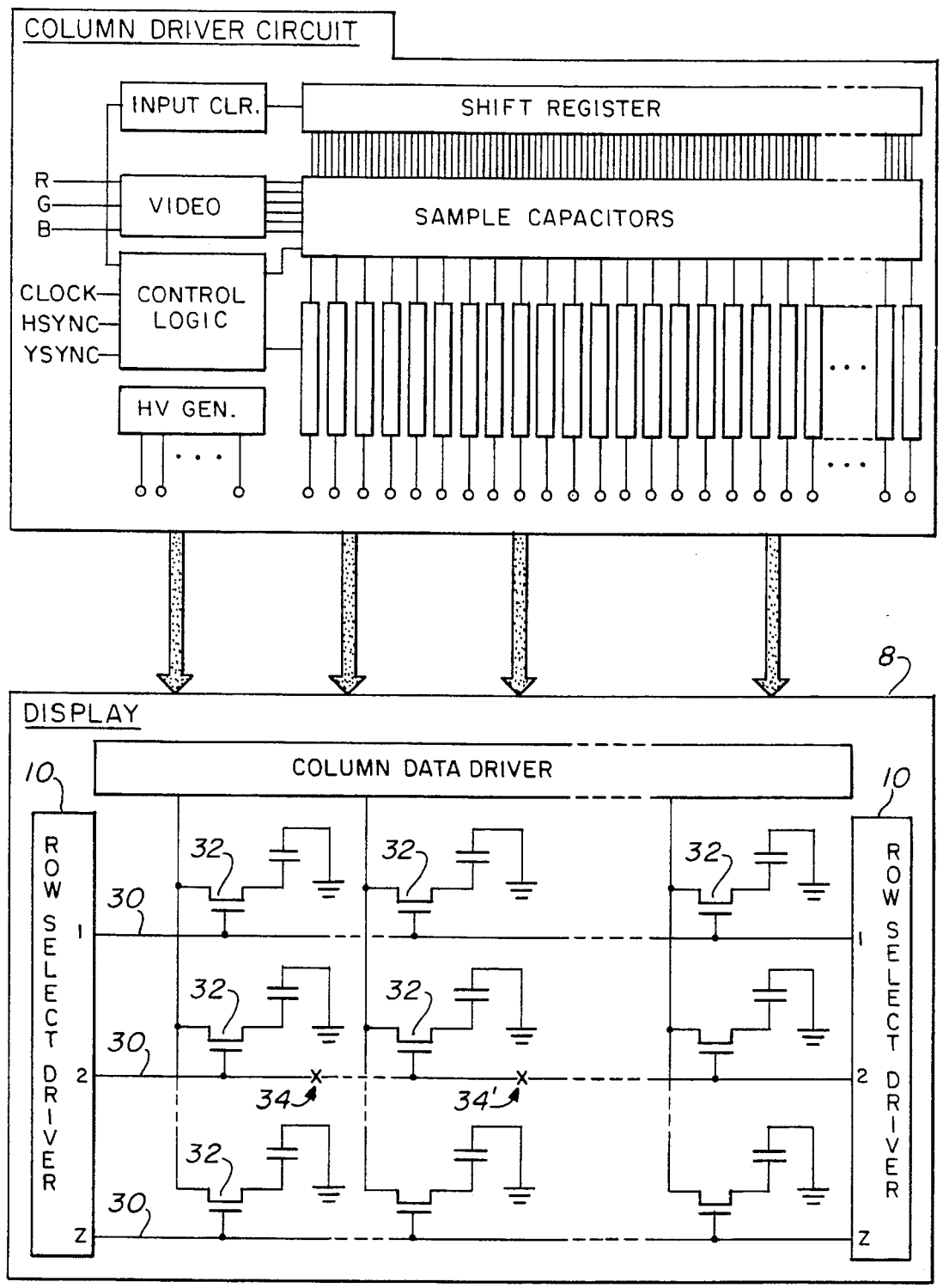
FIG. 1 is a semi-block diagram of an integrated row select driver circuit in accordance with the present invention.

In the present example, the row select driver circuits 10 are connected to both ends of the pixel row line 30 as shown in FIG. 1. However, only one row driver circuit could be used at one end of the pixel row line 30. A line 30 and its associated pixel elements 32 together can be electrically modeled as a single loading capacitor, hereinafter referred to as $C_r$. Driving strength to any given row select line 30 is reduced by one-half if one of the row select driver subcircuits 12 or 14 on one side of the display substrate 8 is electrically cut from row select driver circuit 10. This reduction in driving strength can cause the gray scale of the corresponding pixel row line 30 to be different from the rest of the pixel row lines 30 having subcircuits driving entire row lines 30 from both ends of substrate 8. This is to say a different gray pixel row line may appear relative to other row lines in a display image. To compensate, one of the N redundant subcircuits can be hardwired to replace a damaged subcircuit 12 or 14 so that the gray scale of the pixel row line 30 corresponding to the damaged subcircuit 12 or 14 can be brought back to an acceptable level relative to the other pixel row lines 30.

Similarly, any pixel row line 30 having a fault, represented by X34 in FIG. 1, within the display area of substrate 8 a variance in gray scale can be experienced if the fault is on the far left or far right of pixel row line 30. A fault here indicates a broken point on a row line which comes either from a manufacturing open line defect or by electrically disconnecting a defective pixel element from the row line by cutting both horizontal ends of the defective pixel element. For example, a heavy loading closely approximating the capacitance of a whole row line 30 is attached to the output of the driver subcircuit 12 or 14 on the right hand side of substrate 8 of the row with fault 34. This capacitance is almost equal to the capacitance of the row select line 30 having no faults 34 contained therein and having drivers on both ends of each respective line. Thus, by adding one of the N redundant subcircuits in FIG. 3 forming the proper odd or even stage to row select driver circuit 10 on the right end of substrate 8 on the broken line 30 in FIG. 1, the same driving strength for similar loading in the rest of the lines is obtained. This corrects the gray scale of the right side of row line 30. However, the capacitance loading on the left side of the break 34 is very small and therefore exhibits an undesired gray scale level for the left portion of the broken row line 30. This discrepancy in gray scale can be greatly reduced by adding extra capacitance to the left end of the broken row select line 30.

Figure 4:
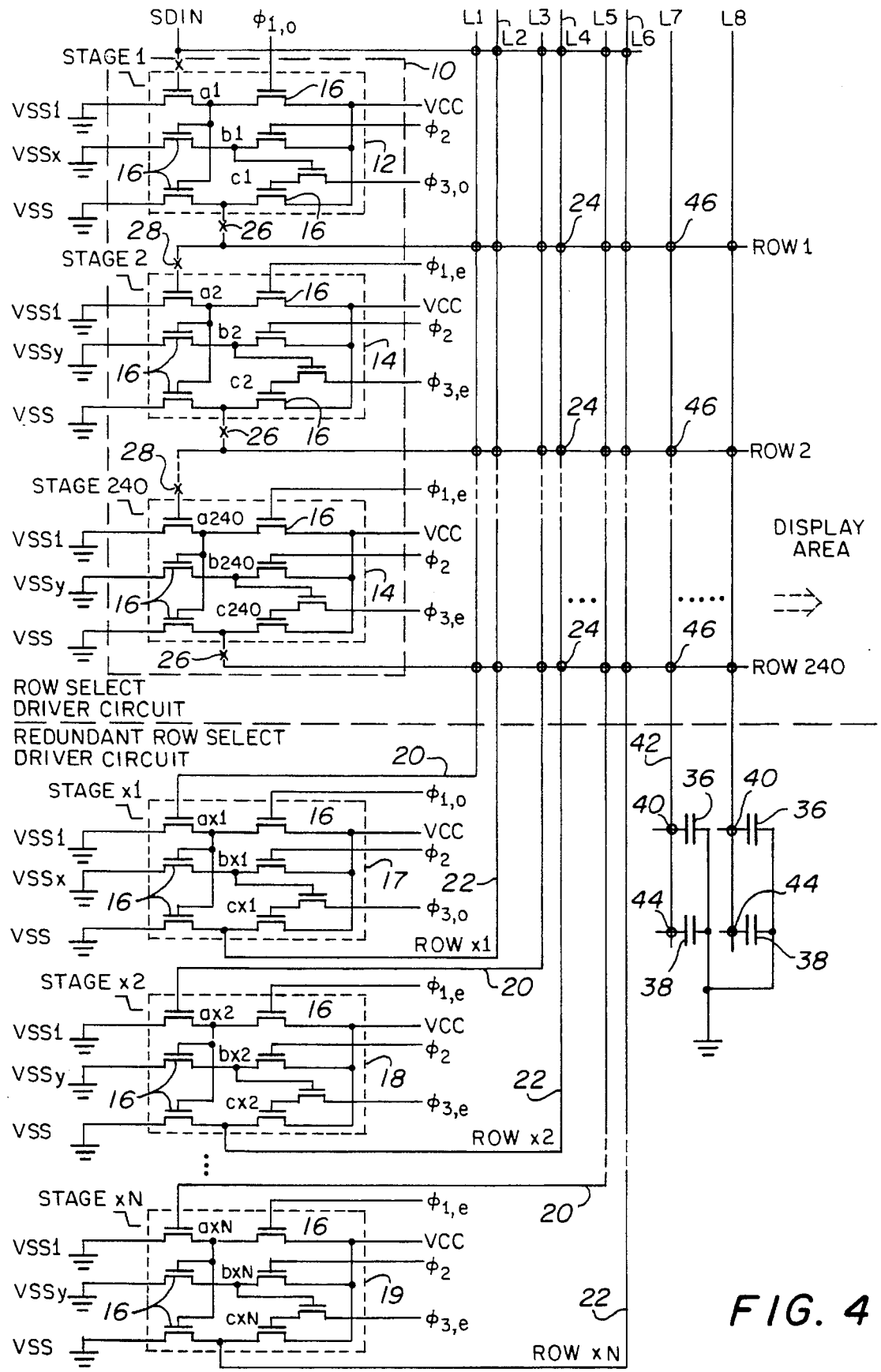
FIG. 4 is a schematic diagram in accordance with the present invention further disclosing means for adding capacitance to any row of the integrated liquid crystal display.

FIG. 4 shows only one side of a row select driver circuit including redundant subcircuits 17, 18, and 19 plus capacitors 36 and 38. As discussed above, a single row line 30 and its associated pixel transistors 32 with two operating driver subcircuits 12 or 14 can be modeled with a capacitance of $C_r$; therefore, the desired loading for a single driver subcircuit 12 or 14 is $C_r/2$. Therefore, in the example given above extra capacitance of approximately $C_r/2$ can be added to the faulty row select line 30 on the left side in order to provide the left side of the broken row select line 30 with approximately the correct amount of capacitance. This adjustment in capacitance allows the gray scale level to be at an acceptable level relative to the other pixel row lines 30 in the display 8.

This capacitance is selectively added to the row select lines 30 by welding three points. By welding at an intersection 40 of one electrode of capacitor 36 and line 42, at intersection 44 of one electrode of capacitor 38 and line 42, and finally at intersection 46 of line 42 and any one of the row lines 30 of the display substrate 8, capacitance is added to a specific row line 30. In a particular instance, the intersection 46 and row 2 will be welded if a broken point existed in far left of row line 2. If row select line 30 of row 2 were broken at a point 34' further in on the display substrate as shown in FIG. 1, rather than at fault 34, such that approximately ¼ of a row select line 30 is on the left side of the break, then extra capacitance of approximately $C_r/4$ would be necessary in order to adjust the gray scale. In the case of a fault at 34' only two welds would be required or in other words only one of the capacitors 36 and 38 would be connected to the row select line 30. Therefore, it is obvious that more precise loading can be obtained by providing a greater number of capacitors in order to accommodate breaks along various points in the row select driver lines. The more capacitors provided, the more precise the adjustment in gray scale can be.

Figure 5:
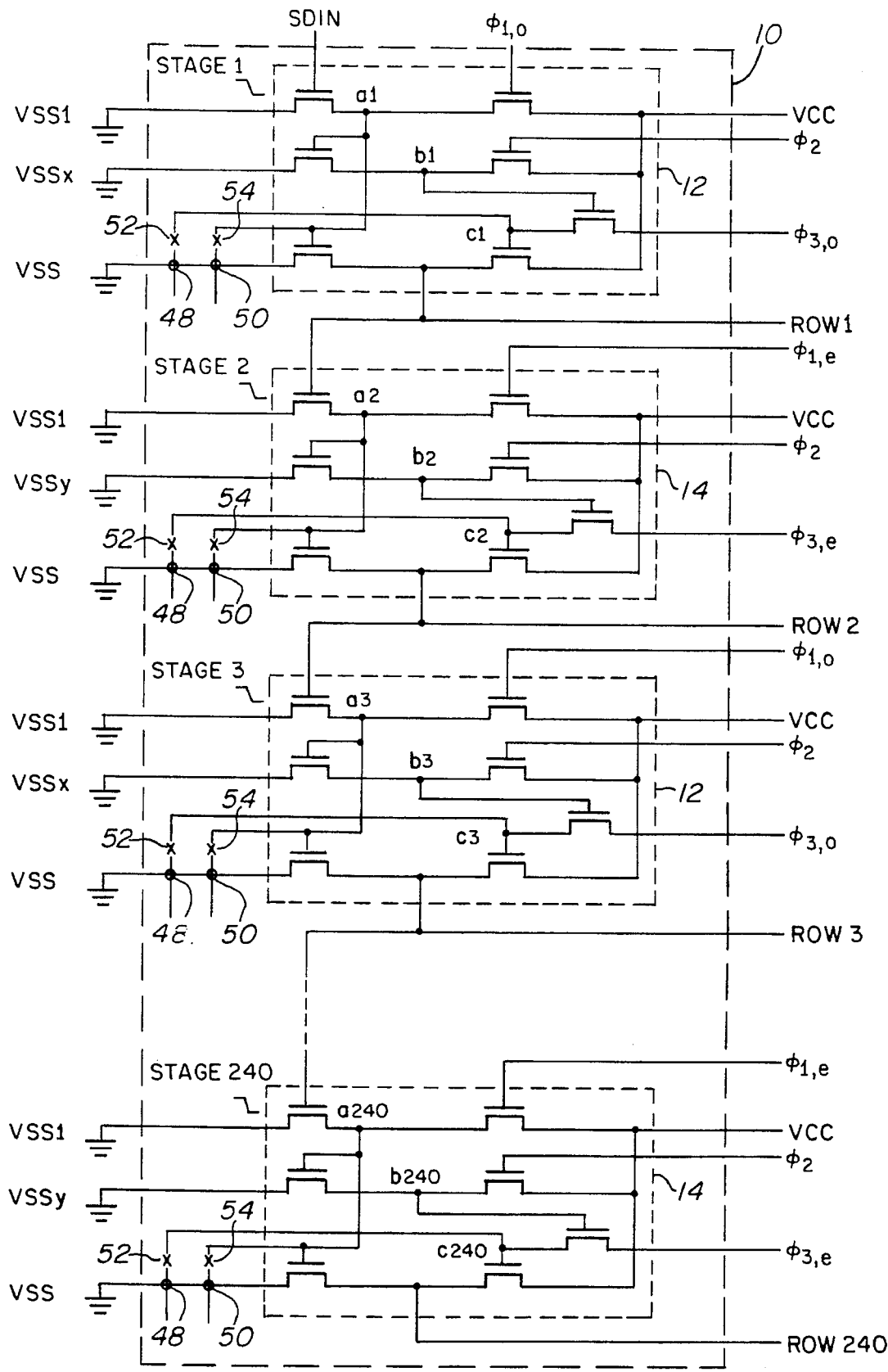
FIG. 5 is a schematic diagram disclosing means for selectively enabling and disabling each subcircuit of an integrated row select driver circuit.

The novel row select driver circuit system disclosed in this invention also provides for enhanced driver circuit diagnostics for assisting in necessary repairs to the display. This can best be shown in reference to FIGS. 1 and 5. In FIG. 1 there are two identical sets of row select driver circuits 10 connected to opposite ends of pixel row lines 30. A row select driver circuit 10 cannot function properly if it has one or more damaged stages without a redundant circuit being added since it works similar to a shift register. In other words, the shift function is stopped when it reaches the first defective or faulty subcircuit 12 or 14. If a display has row select driver circuits 10 on both ends of the row select lines 30 and each row select driver circuit 10 has one or more damaged stages that are not on the same row select line 30, the shift function will appear to work properly because each subcircuit is capable of driving an entire row select line 30.

In practice it has been known to electrically disconnect one of the row select driver circuits 10 from the display unit by lifting up the control signal connectors or making control signals high impedance for the purpose of testing the other row select driver circuit 10 on the opposite side of the row select lines 30. Without one set of signals electrically connected to the opposite side of the row select lines 30 the shift function will fail at the faulty subcircuit 12 or 14 without enabling diagnostics to continue at a point after the failed subcircuit. Therefore, it can be seen that circuit diagnostics cannot be completely achieved if each of the two driver circuits 10 has at least one faulty subcircuit 12 or 14 even though the circuit redundancy disclosed herein will enable the display to function.

To solve this problem two solutions are presented herein. One is to use the novel redundant subcircuits 17, 18, and 19 described above to compensate all damaged driver subcircuits 12 or 14 on at least one side of row select driver circuit 10. Another solution is explained using the circuit diagram of FIG. 5 which shows only one side of row select driver circuit 10 but it is understood that the circuits 10 are identical on both sides. There are two potential welding points 48 and 50 and two potential cutting points 52 and 54 on each stage of row select driver circuit 10. As mentioned above, the shift function fails when only one set of row select driver subcircuits 12 and 14 with at least one damaged subcircuit are connected to each row select line 30. Therefore, welding points 48 and 50 and cutting points 52 and 54 provide testing for any given row of a select driver circuit.

For example, row select driver circuit 10 stage 3 may be tested by electrically connecting a3 and c3 to VSS by welding at points 48 and 50 on the left end of row select driver circuit 10. The two output transistors of stage 3 on the left side are then biased off so that stage 3 on the right end can be checked for proper functioning. After testing stage 3 on the right end two laser cuts at 52 and 54 are performed on the left side to reenable stage 3 on the left side. Similarly, stage 3 on the left then can be tested by performing the same welding and cutting procedures described above to stage 3 on the right side.

In summary, a simple redundant row select driver circuit system has been disclosed. The number, N, of redundant row select driving subcircuits, 17, 18, and 19 necessary in a given display device depends on the manufacturing yield normally experienced. A typical yield can be on the order of requiring one of the N redundant row select driving subcircuits for every 60 subcircuits 12 or 14. Also described is a means for compensating for gray scale level variances experienced by broken row select lines 30 inside the display area. Finally, row select driver diagnostics have been enhanced by incorporating the method described above. By incorporating one or more of the disclosed schemes in the redundant row select driver circuit system described herein a higher manufacturing yield and lower manufacturing cost can be achieved than heretofore known.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

We claim:

1. A row select driver circuit system for correcting defects in a display formed on a substrate, the display having a plurality of pixel elements formed in a plurality of rows and columns, the row select driver circuit system comprising:

a first row select driver circuit on a substrate having a plurality of subcircuits, each of which is coupled to a row of the display for selectively activating a corresponding row of pixel elements, any of the subcircuits having the possibility of being defective;

at least a first redundant subcircuit on the substrate corresponding to at least more than one of said plurality of subcircuits; and connecting means on the substrate electrically connected to the at least first redundant subcircuit and associated with each corresponding subcircuit such that the connecting means is selectively electrically connectable to the row select driver circuit for replacing any defective corresponding subcircuit therein with the redundant subcircuit.

2. The system of claim 1 wherein each row includes first and second inputs at opposing ends of each row, the row select driver system further comprising:

a second row select driver circuit on the substrate having a plurality of subcircuits, each of which is coupled to a corresponding row of the display and has the possibility of being defective and wherein the first and second row select driver circuits are connected to opposite ends of each of the first and second row inputs such that each row is driven from both ends;

at least a second redundant subcircuit on the substrate corresponding to at least more than one of the plurality of subcircuits of the second row select driver circuit; and connecting means on the substrate electrically connected to the at least second redundant subcircuit and associated with each corresponding subcircuit of the second row select driver circuit such that the connecting means is selectively electrically connectable to the second row select driver circuit for replacing any defective corresponding subcircuit therein with the second redundant subcircuit.

3. The system of claim 1 wherein the row select driver subcircuits and the redundant subcircuit each include at least one amorphous silicon thin film transistor.

4. A row select driver circuit system as in claim 1, wherein said plurality of subcircuits comprises:

a first group of N subcircuits driven by first common input signals and having an input and an output where $N \geq 1$;

a second group of N subcircuits driven by second different common input signals and having an input and an output;

the subcircuits of said second group being alternately interconnected with the subcircuits of the first group such that the output of each subcircuit of the first group of subcircuits is connected to the input of the succeeding alternate subcircuit; and except for the $N^{th}$ alternate subcircuit, the output of each subcircuit of the second group is connected to the input of the succeeding alternate subcircuit of the first group.

5. A row select driver circuit system as in claim 4 wherein the at least one redundant subcircuit comprises:

at least one first redundant subcircuit for replacing any one defective subcircuit of the first group of subcircuits; and at least one second redundant subcircuit for replacing any one defective subcircuit of the second group of subcircuits.

6. A row select driver circuit system wherein the row select driver circuit is deposited on a display substrate having a plurality of pixel elements formed into a plurality of rows and columns, the system comprising:

a plurality of successively connected subcircuits forming the row select driver circuit wherein each subcircuit drives one of a plurality of successive rows of the display and each subcircuit presents an input and an output and the output of each subcircuit is connected to the input of a successive subcircuit and to a row of the display, each of the subcircuits having the possibility of being defective;

at least one additional subcircuit corresponding to at least more than one of the plurality of subcircuits and presenting an input and an output and being deposited on the display substrate for replacing any corresponding defective subcircuit; and electrical connection means for selectively connecting the additional subcircuit input to the display row preceding the corresponding defective circuit and the output to the row select driver subcircuit succeeding the corresponding defective subcircuit to replace the defective subcircuit.

7. The system of claim 6 further including electrical connection lines connected to the input and output of the additional subcircuit and adjacent to and electrically isolated from each row of the display such that the additional subcircuit input can be selectively electrically connected to the row of the display preceding said corresponding defective subcircuit and the additional subcircuit output can be selectively connected to the display row immediately following the corresponding defective subcircuit and the input and output of the corresponding defective subcircuit can be electrically disconnected from their respective rows.

8. The system of claim 7 wherein the row select driver subcircuits and the additional subcircuit are formed of thin film transistors.

9. The system of claim 8 wherein each of the electrical connection lines overlap each of the display rows and are electrically insulated from the rows.

10. The system of claim 9 wherein the electrical connection lines are selectively electrically connected to a display row by laser welding.

11. A method of providing at least one redundant subcircuit for a plurality of successively connected subcircuits deposited on a display substrate, each subcircuit presenting an input and an output with the output of each subcircuit being connected to the input of a successive subcircuit and to a row of the display thereby forming a row driver circuit on the display, each of the subcircuits having the possibility of being defective, the method comprising the steps of:

depositing on the substrate at least one additional subcircuit corresponding to at least more than one of said successively connected subcircuits, said additional subcircuit presenting an input and an output and wherein the total number of additional subcircuits is less than the total number of successively connected subcircuits;

connecting the input of the additional subcircuit to the output of the row driver subcircuit immediately preceding any corresponding defective row driver subcircuit;

connecting the output of the additional subcircuit to the input of a row driver subcircuit immediately following the corresponding defective row driver subcircuit; and disconnecting the input and output of the defective subcircuit from the row driver circuit thereby replacing the corresponding defective subcircuit with the additional subcircuit.

12. A row select driver circuit system for a display formed on a substrate, the display presenting a plurality of pixel elements formed in a plurality of rows and columns, a properly functioning pixel row having a given load capacitance, the row select driver circuit system comprising:

first and second row select driver circuits on the substrate connected to opposite ends of the plurality of rows wherein each row select driver circuit includes a plurality of subcircuits, each of which is electrically coupled to a row of the display for selectively providing a proper drive to a corresponding row of properly functioning pixel elements, each pixel row having the possibility of being defective;

at least a first redundant subcircuit on the substrate;

at least one capacitor on the substrate for providing additional loading capacitance to a portion of a pixel row having a defect for adjusting the gray scale of the defective pixel row relative to the other pixel rows;

first connecting means on the substrate electrically connected to the output of the redundant subcircuit and wherein the first connecting means is selectively connectable to one end of the defective pixel row at the first row select driver circuit for maintaining the proper drive to the defective pixel row; and second connecting means on the substrate electrically connected to the capacitor and selectively connectable to the other end of the defective pixel row at the second row select driver circuit for connecting additional capacitance to the other end of the defective pixel row to approximate the load capacitance of a properly functioning pixel row so as to provide an acceptable gray scale for the other end of the defective pixel row.

13. The system of claim 12 further including:

multiple capacitors on the substrate;

the second connecting means being selectively connectable to the multiple capacitors and being selectively connectable to said other end of the faulty pixel row such that a predetermined number of capacitors are selectively connected to the faulty pixel row portion for approximating the capacitance of a properly functioning pixel row.

14. A row select driver system in a display formed on a substrate, the display presenting a plurality of pixel elements formed in a plurality of rows and columns, the row select driver circuit system comprising:

first and second row select driver circuits on the substrate connected to opposite ends of the plurality of pixel rows wherein each row select driver circuit includes a plurality of subcircuits, each having an output electrically coupled to a corresponding row of the display for selectively activating said corresponding row of pixel elements;

a plurality of transistors forming each subcircuit and including at least one output transistor;

disabling means coupled to each subcircuit for selectively disabling each at least one subcircuit output transistor to allow testing of the subcircuit connected to the opposite end of the row from the disabled circuit; and enabling means coupled to each subcircuit for selectively enabling each disabled circuit when the testing is completed.

* * * * *